United States Patent  
Inagaki

(10) Patent No.: US 10,237,667 B2
(45) Date of Patent: Mar. 19, 2019

(54) MEASUREMENT SYSTEM AND MEASUREMENT METHOD

(71) Applicant: KYOCERA Corporation, Kyoto-shi, Kyoto (JP)

(72) Inventor: Tomohiro Inagaki, Yokohama-shi (JP)

(73) Assignee: Kyocera Corporation, Kyoto (JP)

( * ) Notice: Subject to any disclaimer, the term of this patent is extended or adjusted under 35 U.S.C. 154(b) by 15 days.

(21) Appl. No.: 15/551,208

(22) PCT Filed: Feb. 19, 2016

(86) PCT No.: PCT/JP2016/000896
§ 371 (c)(1),
(2) Date: Aug. 15, 2017

(87) PCT Pub. No.: WO2016/136221
PCT Pub. Date: Sep. 1, 2016

(65) Prior Publication Data
US 2018/0035225 A1    Feb. 1, 2018

(30) Foreign Application Priority Data

Feb. 26, 2015    (JP) .................................. 2015-036432

(51) Int. Cl.
*H04R 29/00*    (2006.01)
*G01H 17/00*    (2006.01)
(Continued)

(52) U.S. Cl.
CPC .............. *H04R 29/001* (2013.01); *G01H 1/00* (2013.01); *G01H 3/00* (2013.01); *G01H 17/00* (2013.01);
(Continued)

(58) Field of Classification Search
CPC ........ H04R 29/001; H04R 3/04; G01H 17/00; H04M 1/24
(Continued)

(56) References Cited

U.S. PATENT DOCUMENTS

2011/0164757 A1* 7/2011 Sibbald .................. H04M 1/24
                                                                      381/58
2014/0283614 A1    9/2014 Inagaki et al.
(Continued)

FOREIGN PATENT DOCUMENTS

JP    2005-348193 A    12/2005
JP    2014-060467 A    4/2014
(Continued)

OTHER PUBLICATIONS

Written Opinion (Form PCT/ISA/237) dated Apr. 12, 2016, issued for PCT/JP2016/000896 with Concise Explanation.
(Continued)

*Primary Examiner* — David L Ton

(57) ABSTRACT

A measurement method of this disclosure is for evaluating an electronic device (100) that transmits air-conducted sound, generated by vibration of a vibrating body (102), to a user by the vibrating body (102) being placed in contact with a human ear. The measurement method includes placing the vibrating body (102) in contact with an ear model unit (50), measuring air-conducted sound generated by the electronic device (100) and air-conducted sound generated in the ear model unit (50), and selecting a correction value from among a plurality of correction values.

12 Claims, 9 Drawing Sheets

(51) Int. Cl.
  *H04R 3/04* (2006.01)
  *H04M 1/24* (2006.01)
  *H04R 1/02* (2006.01)
  *H03G 3/32* (2006.01)
  *G01H 1/00* (2006.01)
  *G01H 3/00* (2006.01)
  *H03G 3/30* (2006.01)
  *H03G 5/02* (2006.01)
  *H03G 5/16* (2006.01)
  *H04R 5/027* (2006.01)
  *H04R 25/00* (2006.01)
  *H04R 1/08* (2006.01)
  *H04M 1/05* (2006.01)

(52) U.S. Cl.
  CPC ............ *H03G 3/3005* (2013.01); *H03G 3/32* (2013.01); *H03G 5/025* (2013.01); *H03G 5/165* (2013.01); *H04M 1/24* (2013.01); *H04R 1/02* (2013.01); *H04R 3/04* (2013.01); *H04R 5/027* (2013.01); *H04R 25/30* (2013.01); *H04M 1/05* (2013.01); *H04R 1/026* (2013.01); *H04R 1/08* (2013.01); *H04R 2460/13* (2013.01)

(58) Field of Classification Search
  USPC .................................. 381/57, 58, 94.2, 94.3
  See application file for complete search history.

(56) References Cited

U.S. PATENT DOCUMENTS

| | | | |
|---|---|---|---|
| 2014/0363020 A1* | 12/2014 | Endo | H04R 1/08 381/98 |
| 2015/0128708 A1* | 5/2015 | Ikeda | A61B 5/12 73/585 |
| 2015/0256943 A1* | 9/2015 | Inagaki | H04R 29/00 381/60 |
| 2016/0134977 A1* | 5/2016 | Inagaki | H04R 17/00 381/60 |
| 2016/0143563 A1* | 5/2016 | Inagaki | H04R 25/30 73/585 |
| 2016/0150328 A1* | 5/2016 | Inagaki | H04R 25/30 381/60 |
| 2016/0165359 A1* | 6/2016 | Inagaki | H04R 29/00 381/60 |

FOREIGN PATENT DOCUMENTS

JP  5486041 B2  5/2014
JP  2014-239346 A  12/2014

OTHER PUBLICATIONS

International Search Report (Form PCT/ISA/210) dated Apr. 12, 2016, issued for PCT/JP2016/000896.

* cited by examiner

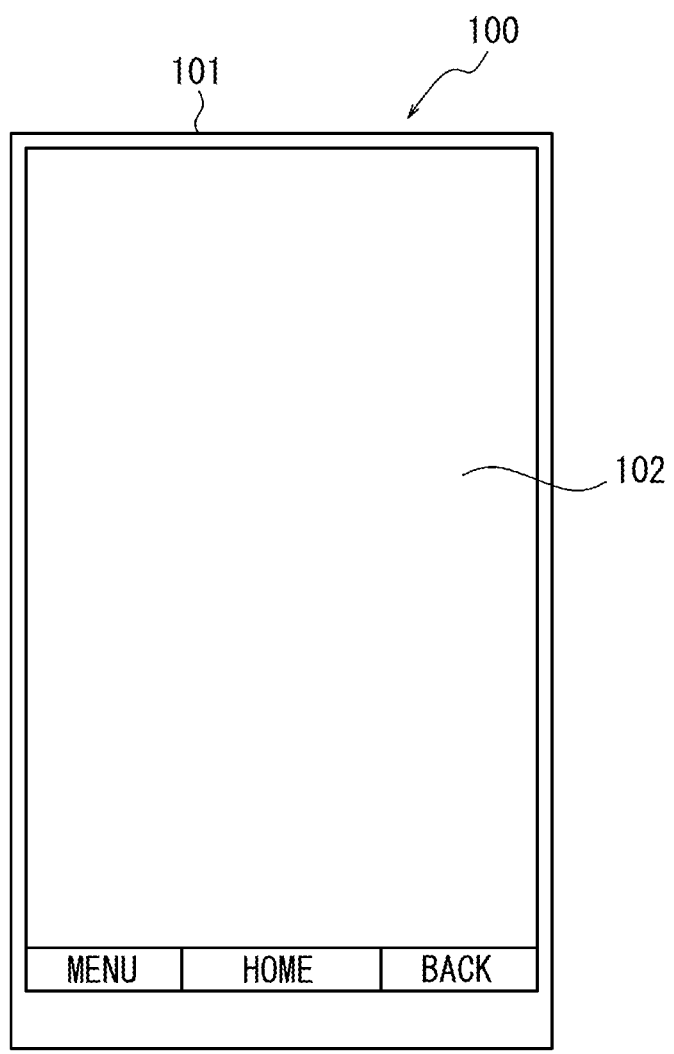

| Type | Difference (dB) | Correction values in each frequency band ||||||| 
|---|---|---|---|---|---|---|---|---|
| | | 0~200Hz | 201~320Hz | 321~400Hz | 401~500Hz | 501~640Hz | 641~800Hz | 801~1000Hz |
| A | 50 or greater | 0 | 0 | 0 | −1 | −2 | −4 | −5 |
| B | 40 to less than 50 | 0 | 0 | 3 | 2 | 2 | 3 | 4 |
| C | 30 to less than 40 | 0 | 1 | 5 | 6 | 7 | 6 | 7 |
| D | Less than 30 | 0 | 1 | 8 | 9 | 12 | 9 | 10 |

Air-conducted sound correction values

Type  A  B  C  D  Manual input

| Type | Difference (dB) | Correction value in each frequency band ||||||| 
|---|---|---|---|---|---|---|---|---|
| | | 0~200 Hz | 201~320 | 321~400 | 401~500 | 501~640 | 641~800 | 801~1000 |
| | 50 or greater | [+]<br>0<br>[-] | [+]<br>0<br>[-] | [+]<br>0<br>[-] | [+]<br>-1<br>[-] | [+]<br>-2<br>[-] | [+]<br>-4<br>[-] | [+]<br>-5<br>[-] |

FIG. 8

Step 1: Measure air-conducted sound and vibration sound without correction

Step 2: Calculate the difference by subtracting vibration sound from air-conducted sound Step 3: Select the type in accordance with the difference Step 4: Apply the selected type of correction value

MEASUREMENT SYSTEM AND MEASUREMENT METHOD

CROSS-REFERENCE TO RELATED APPLICATION

This application claims priority to and the benefit of Japanese Patent Application No. 2015-036432 filed Feb. 26, 2015, the entire contents of which are incorporated herein by reference.

TECHNICAL FIELD

This disclosure relates to a measurement system and measurement method for evaluating an electronic device, such as a mobile phone, earphone, or headphones, that transmits sound by vibration by placement of an acoustic apparatus within or against a human ear, the acoustic apparatus including a vibrating body.

BACKGROUND

JP 2005-348193 A (PTL 1) discloses an electronic device, in particular an acoustic apparatus such as a mobile phone, that transmits air-conducted sound and vibration sound to a user. In PTL 1, the air-conducted sound refers to a sound transmitted to the user's auditory nerve when the eardrum vibrates upon vibration of air, caused by a vibrating object, reaching the eardrum through the external ear canal. In PTL 1, the vibration sound refers to sound that is transmitted to the user's auditory nerve through a portion of the user's body, such as the cartilage of the outer ear, that is in contact with a vibrating object.

In the telephone disclosed in PTL 1, a rectangular plate-shaped vibrating body, composed of a piezoelectric bimorph and a flexible substance, is attached to an outer surface of a housing via an elastic member. PTL 1 also discloses that when voltage is applied to the piezoelectric element bimorph in the vibrating body, the piezoelectric material expands and contracts in the longitudinal direction, causing the vibrating body to undergo bending vibration. Air-conducted sound and vibration sound are then transmitted to the user when the user brings the vibrating body in contact with the auricle.

CITATION LIST

Patent Literature

PTL 1: JP 2005-348193 A
PTL 2: JP 5486041 B2

SUMMARY

Technical Problem

The measurement system and measurement method of this disclosure are provided to allow evaluation of an electronic device, such as a variety of acoustic apparatuses or hearing aids, that includes a vibrating body.

Solution to Problem

A measurement method of this disclosure is for evaluating an electronic device that transmits air-conducted sound, generated by vibration of a vibrating body, to a user by the vibrating body being placed in contact with a human ear, the measurement method including placing the vibrating body in contact with an ear model unit; measuring air-conducted sound generated by the electronic device and air-conducted sound generated in the ear model unit; and selecting a correction value from among a plurality of correction values.

Advantageous Effect

The measurement system and measurement method according to this disclosure allow evaluation of an electronic device, such as a variety of acoustic apparatuses or hearing aids, that includes a vibrating body.

BRIEF DESCRIPTION OF THE DRAWINGS

In the accompanying drawings:

FIG. 2 is a plan view illustrating an example of an electronic device targeted for measurement;
FIG. 7 is a partial view of a display example indicating the currently selected type and the list of corresponding correction values on the display;
FIG. 8 illustrates an example of the measurement method of this disclosure.

DETAILED DESCRIPTION

Embodiments of this disclosure are described below, with reference to the drawings.

Embodiment 1

Figure 1:
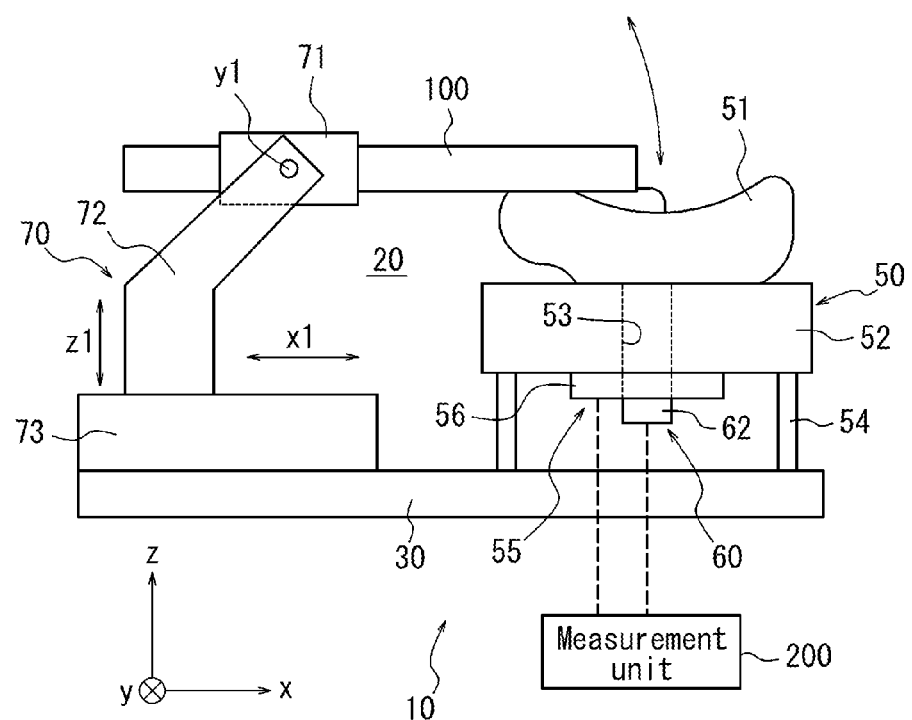
FIG. 1 illustrates the configuration of a measurement system according to Embodiment 1 of this disclosure.

FIG. 1 schematically illustrates the configuration of a measurement system according to Embodiment 1 of this disclosure. The measurement system 10 of this embodiment includes a mount 20 and a measurement unit 200. The mount 20 is provided with an ear model unit 50 supported by a base 30 and with a holder 70 that supports an electronic device 100 targeted for measurement. The electronic device 100 is assumed herein to be a mobile phone, such as a smartphone, that includes a rectangular panel 102 and vibrates with the panel 102 as a vibrating body. The panel 102 is larger than a human ear and is disposed on a surface of a rectangular housing 101, as illustrated in the plan view in FIG. 2. First, the configuration of the mount 20 is described.

The ear model unit 50 is modeled after a human ear and includes an ear model 51 and an artificial external ear canal unit 52 joined to the ear model 51. An artificial external ear canal 53 is formed in the central region of the artificial external ear canal unit 52. The ear model unit 50 is supported by the base 30 via a support member 54 at the periphery of the artificial external ear canal unit 52.

The ear model unit 50 is made from similar material to the material of an ear model typically used in, for example, a manikin such as a head and torso simulator (HATS), Knowles electronic manikin for acoustic research (KE-MAR), or the like, such as material conforming to IEC 60959. This material may, for example, be formed with rubber or another material having Shore 00 of 25 to 55. The hardness of rubber may, for example, be measured in conformity with international rubber hardness (IRHD/M method) conforming to JIS K 6253, ISO 48, or the like. A fully automatic IRHD/M method micro-size international rubber hardness gauge GS680 by Teclock Corporation may suitably be used as a hardness measurement system. Considering the variation in ear hardness by age, approximately two or three types of the ear model unit 50 with different hardnesses may be prepared and used interchangeably. The amount of vibration converted to air-conducted sound after propagating to the artificial external ear canal 53 varies by the hardness and shape of the ear model 51 in the ear model unit 50 and by the hardness and length of the artificial external ear canal 53. Hence, when artificial external ear canals 53 with different hardnesses and lengths are used interchangeably, the below-described correction values are preferably taken into account.

The thickness of the artificial external ear canal unit 52, i.e. the length of the artificial external ear canal 53, corresponds to the length up to the human eardrum (cochlea) and for example is suitably set in a range of 20 mm to 40 mm. In this embodiment, the length of the artificial external ear canal 53 is set to approximately 30 mm.

The ear model unit 50 further includes a vibration detector 55. The vibration detector 55 is disposed at the periphery of the opening of the artificial external ear canal 53, on the opposite end face of the artificial external ear canal unit 52 from the ear model 51. The vibration detector 55 measures vibration transmitted to the opposite end face. The vibration detector 55 detects the amount of vibration transmitted through the artificial external ear canal unit 52 when the vibrating panel 102 is placed against the ear model unit 50. In other words, the vibration detector 55 detects the amount of vibration corresponding to the vibration sound that is heard without passing through the eardrum when the panel 102 is pressed against a human ear so that vibration of the panel 102 directly vibrates the inner ear. The vibration detector 55 is, for example, configured using a vibration detection element 56 that has flat output characteristics in the measurement frequency range of the electronic device 100 (for example, from 0.1 kHz to 10 kHz), is lightweight, and can accurately measure even slight vibrations. This vibration detection element 56 is, for example, configured using a vibration pickup such as a piezoelectric acceleration pickup. The vibration pickup may, for example, be the vibration pickup PV-08A by Rion Corporation.

Figure 3A:
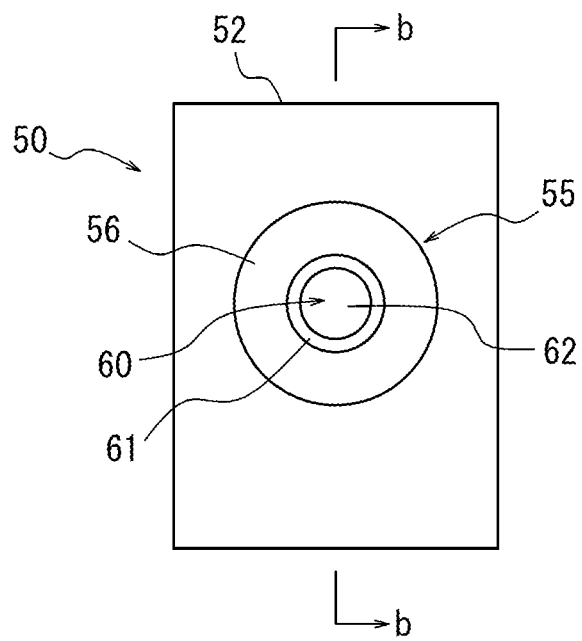
FIGS. 3A and 3B are detailed diagrams of the ear model unit in FIG. 1.

FIG. 3A is a plan view of the ear model unit 50 from the base 30 side. While FIG. 3A illustrates an example of providing a ring-shaped vibration detection element 56 that surrounds the periphery of the opening of the artificial external ear canal 53, a plurality of vibration detection elements 56 may be provided instead. When provided, the plurality of vibration detection elements 56 may be disposed at appropriate intervals at the periphery of the artificial external ear canal 53, or two vibration detection elements 56 may be disposed to sandwich the periphery of the opening in the artificial external ear canal 53. While the artificial external ear canal unit 52 is rectangular in FIG. 3A, the artificial external ear canal unit 52 may be any shape.

The ear model unit 50 further includes a sound pressure gauge 60. The sound pressure gauge 60 measures the sound pressure of sound propagating through the artificial external ear canal 53. When the panel 102 is pressed against a human ear, the sound pressure gauge 60 measures sound pressure corresponding to an air-conducted component heard directly through the eardrum by vibration of air due to vibration of the panel 102 and sound pressure corresponding to an air-conducted component, heard through the eardrum, of sound produced in the ear itself by the inside of the external ear canal vibrating because of vibration of the panel 102.

Figure 3B:
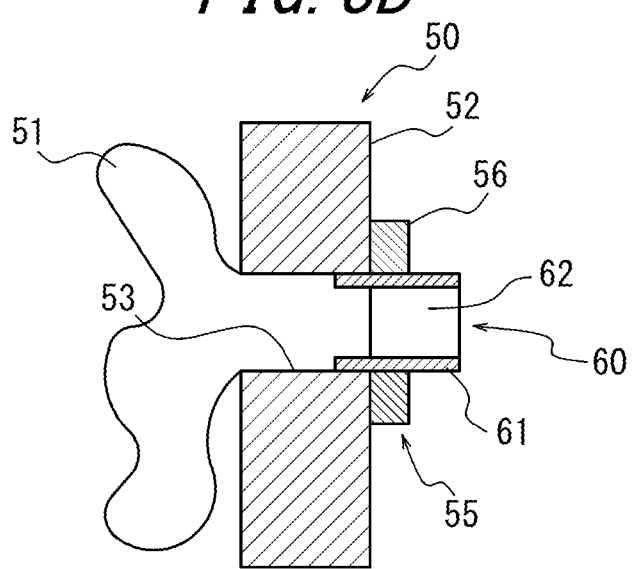

As illustrated by FIG. 3B, which is a cross-sectional diagram along the b-b line in FIG. 3A, the sound pressure gauge 60 includes a microphone 62 held by a tube member 61 that extends from the artificial external ear canal 53. The microphone 62 is, for example, configured using a measurement capacitor microphone that has a low self-noise level and that has flat output characteristics in the measurement frequency range of the electronic device 100. The microphone 62 may, for example, be the capacitor microphone UC-59 produced by Rion Corporation. The microphone 62 is disposed so that the sound pressure detection face nearly matches the end face of the artificial external ear canal unit 52. The microphone 62 may, for example, be supported by the artificial external ear canal unit 52 or the base 30 and disposed in a floating state with respect to the outer wall of the artificial external ear canal 53.

Next, the holder 70 is described. If the electronic device 100 is a mobile phone, such as a smartphone, having a rectangular shape in plan view, then when a person holds the mobile phone in one hand and presses the mobile phone against his ear, both sides of the mobile phone are normally supported by the hand. The pressing force and contact position of the mobile phone against the ear differ for each person, i.e. user, and also vary during use. In this embodiment, the holder 70 holds the electronic device 100 by simulating such a form of using a mobile phone.

To this end, the holder 70 is provided with a support 71 that supports both sides of the electronic device 100. The support 71 is attached to one end of an arm 72 so as to be rotatable about an axis y1, which is parallel to the y-axis, in a direction to press the electronic device 100 against the ear model unit 50. The other end of the arm 72 is joined to a movement adjuster 73 provided on the base 30. The movement adjuster 73 can adjust movement of the arm 72 in a vertical direction x1 of the electronic device 100 as supported by the support 71 and in a direction z1 that presses the electronic device 100 against the ear model unit 50. The direction x1 is parallel to the x-axis, which is orthogonal to the y-axis, and the direction z1 is parallel to the z-axis, which is orthogonal to the y-axis and the x-axis.

By rotating the support 71 about the axis y1 or by moving the arm 72 in the z1 direction, the force pressing the ear model unit 50 against the vibrating body (panel 102) is thus adjusted for the electronic device 100 supported by the support 71. In this embodiment, the pressing force is adjusted in a range of 0 N to 10 N, preferably a range of 3 N to 8 N.

A range of 0 N to 10 N allows measurement over a wide range, sufficiently wider than the range of the pressing force that is envisioned when a human presses the electronic device against the ear, for example to converse. The case of 0 N includes, for example, not only the case of contact that does not press against the ear model unit 50, but also the case of holding the electronic device 100 at a distance from the ear model unit 50 in increments of 1 cm and measuring at each distance. This approach also allows measurement with the microphone 62 of the degree of attenuation of air-conducted sound due to distance, thus making the measurement system more convenient. The range of 3 N to 8 N is assumed to be the range of the average force with which a person with normal hearing presses a conventional speaker against the ear to converse. Differences may exist by race or gender, but what matters is that in an electronic device such as a conventional mobile phone or smartphone equipped with a conventional speaker, the measurement system 10 can preferably measure the vibration sound and air-conducted sound for the pressing force that a user typically applies.

By adjusting movement of the arm 72 in the x1 direction, the contact position of the electronic device 100 with respect to the ear model unit 50 can be adjusted so that, for example, the panel 102 covers nearly the entire ear model unit 50, or so that the panel 102 covers a portion of the ear model unit 50, as illustrated in FIG. 1. The arm 72 may also be configured to allow adjustment of the electronic device 100 to a variety of contact positions with respect to the ear model unit 50 by making the arm 72 adjustable by movement in a direction parallel to the y-axis, or by making the arm 72 adjustable by rotation about an axis parallel to the x-axis or the z-axis.

Figure 4:
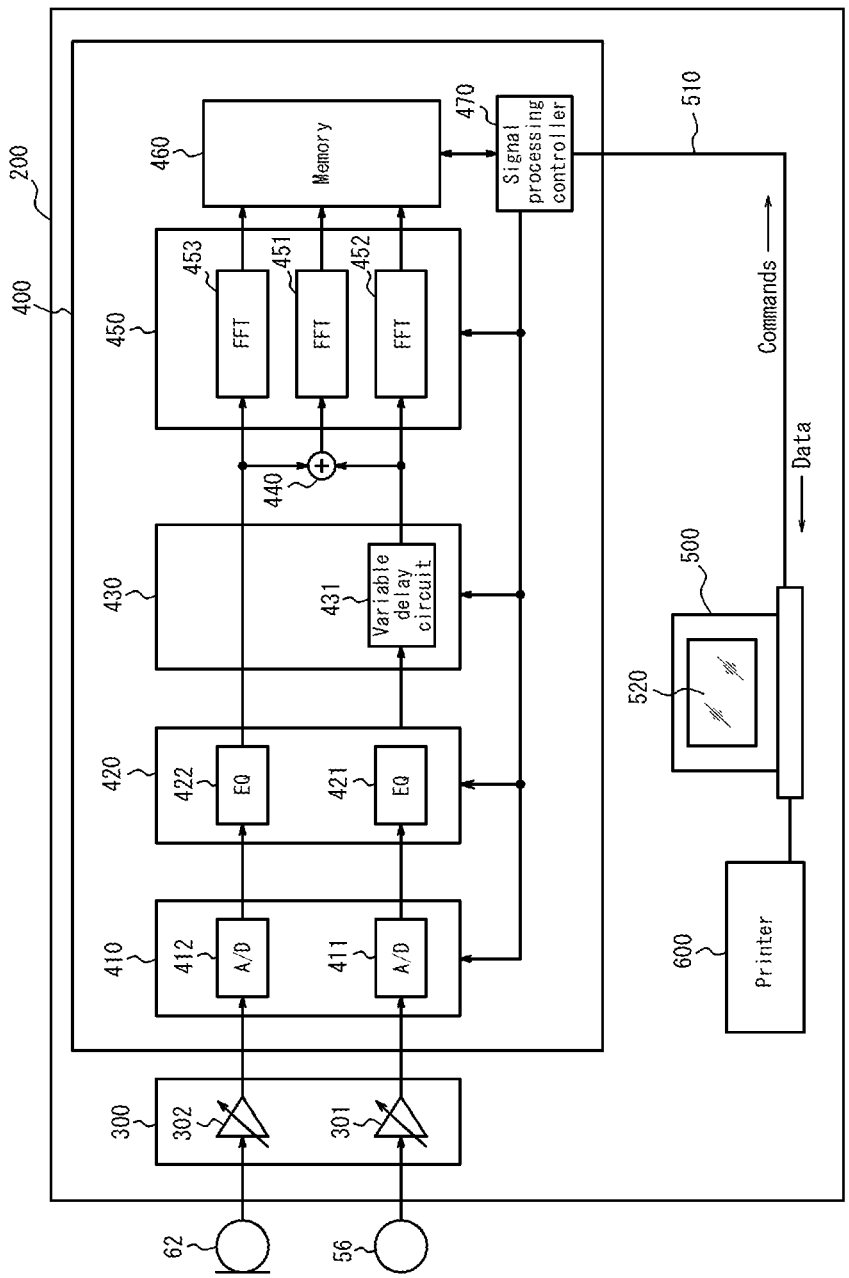
FIG. 4 is a functional block diagram illustrating the configuration of the measurement unit in FIG. 1.

Next, the structure of the measurement unit 200 in FIG. 1 is described. FIG. 4 is a functional block diagram illustrating the configuration of the measurement unit 200. In this embodiment, the measurement unit 200 measures the amount of vibration and the sound pressure transmitted through the ear model unit 50 by vibration of the electronic device 100 targeted for measurement, i.e. sensory sound pressure that combines vibration sound and air-conducted sound, and includes a sensitivity adjuster 300, a signal processor 400, a personal computer (PC) 500, and a printer 600.

Output of the vibration detection element 56 and the microphone 62 is provided to the sensitivity adjuster 300. The sensitivity adjuster 300 includes a variable gain amplifier circuit 301 that adjusts the amplitude of the output of the vibration detection element 56 and a variable gain amplifier circuit 302 that adjusts the amplitude of the output of the microphone 62. The circuits 301 and 302 independently adjust the amplitude of corresponding analog input signals to a required amplitude either manually or automatically. The sensitivity adjuster 300 thus corrects error in the sensitivity of the vibration detection element 56 and the microphone 62. The variable gain amplifier circuits 301 and 302 are configured to allow adjustment of the amplitude of the input signals over a range of, for example, ±20 dB.

Output of the sensitivity adjuster 300 is input into the signal processor 400. The signal processor 400 includes an A/D converter 410, frequency characteristic adjuster 420, phase adjuster 430, output combiner 440, frequency analyzer 450, memory 460, and signal processing controller 470. The A/D converter 410 includes an A/D conversion circuit (A/D) 411 that converts the output of the variable gain amplifier circuit 301 into a digital signal and an A/D conversion circuit (A/D) 412 that converts the output of the variable gain amplifier circuit 302 into a digital signal. The A/D converter 410 thus converts the corresponding analog input signals into digital signals. The A/D conversion circuits 411 and 412 are, for example, 16 bits or more, can support 96 dB or more by dynamic range conversion, and can be configured so that the dynamic range is changeable.

Output of the A/D converter 410 is provided to the frequency characteristic adjuster 420. The frequency characteristic adjuster 420 includes an equalizer (EQ) 421 that adjusts the frequency characteristics of the detection signal from the vibration detection element 56, i.e. the output of the A/D conversion circuit 411, and an equalizer (EQ) 422 that adjusts the frequency characteristics of the detection signal from the microphone 62, i.e. the output of the A/D conversion circuit 412. The frequency characteristic adjuster 420 adjusts the frequency characteristics of the respective input signals independently to frequency characteristics near the auditory sensation of the human body either manually or automatically. The equalizers 421 and 422 may, for example, be configured with a graphical equalizer having a plurality of bands, a low pass filter, a high pass filter, or the like.

Output of the frequency characteristic adjuster 420 is provided to the phase adjuster 430. The phase adjuster 430 includes a variable delay circuit 431 that adjusts the phase of the detection signal from the vibration detection element 56, i.e. the output of the equalizer 421. Since sound is not transmitted through the material of the ear model unit 50 at the same speed as through human muscle or bone, the phase relationship between the output of the vibration detection element 56 and the output of the microphone 62 is assumed to be shifted greatly from that of a human ear, particularly at high frequencies.

If the phase relationship between the output of the vibration detection element 56 and the microphone 62 shifts greatly, then upon combining the two outputs with the below-described output combiner 440, amplitude peaks and dips may appear at unusual times, and the combined output may be amplified or diminished. For example, if the transmission speed of sound detected by the microphone 62 is 0.2 ms slower than the transmission speed of vibration detected by the vibration detection element 56, then the combined output differs from the combined output in the case of the transmission speeds not being misaligned. As a result, peaks and dips not produced in a human ear end up occurring.

Therefore, in this embodiment, in accordance with the measurement frequency range of the electronic device 100 targeted for measurement, the variable delay circuit 431 adjusts the phase of the detection signal from the vibration detection element 56 as output by the equalizer 421. For example, in the case of the measurement frequency range of the electronic device 100 being from 100 Hz to 10 kHz, the variable delay circuit 431 adjusts the phase of the detection signal from the vibration detection element 56 over a range of approximately ±10 ms (corresponding to ±100 Hz) at least in increments smaller than 0.1 ms (corresponding to 10 kHz). In the case of a human ear as well, phase misalignment occurs between vibration sound and air-conducted sound. Therefore, phase adjustment by the variable delay circuit 431 does not refer to matching the phase of the detection signals from the vibration detection element 56 and the microphone 62, but rather to matching the phase of these detection signals to the actual auditory sensation by the ear.

Output of the phase adjuster 430 is provided to the output combiner 440. The output combiner 440 combines the detection signal, the phase of which is adjusted by the variable delay circuit 431, from the vibration detection element 56 with the detection signal that passes from the microphone 62 through the phase adjuster 430. The resulting sensory sound pressure thus approximates the human body in combining the amount of vibration and the sound pressure, i.e. the vibration sound and the air-conducted sound, transmitted by vibration of the electronic device 100 targeted for measurement.

The combined output of the output combiner 440 is input into the frequency analyzer 450. The frequency analyzer 450 includes a fast Fourier transform (FFT) 451 that performs frequency analysis on the combined output of the output combiner 440. Power spectrum data corresponding to the sensory sound pressure, in which the vibration sound and air-conducted sound are combined, are thus obtained from the FFT 451.

Furthermore, in this embodiment, the frequency analyzer 450 is provided with FFTs 452 and 453 that perform frequency analysis on the signals before combination by the output combiner 440, i.e. on the detection signal from the vibration detection element 56 and the detection signal from the microphone 62 that pass through the phase adjuster 430. In this way, power spectrum data corresponding to the vibration sound are obtained from the FFT 452, and power spectrum data corresponding to the air-conducted sound are obtained from the FFT 453.

In the FFTs 451 to 453, analysis points are set for the frequency component (power spectrum) in correspondence with the measurement frequency range of the electronic device 100. For example, when the measurement frequency range of the electronic device 100 is 100 Hz to 10 kHz, analysis points are set so as to analyze the frequency component at each point when dividing a logarithmic graph of the measurement frequency range into 100 to 200 equal intervals.

The output of the FFTs 451 to 453 is stored in the memory 460. The memory 460 has the capacity of at least a double buffer that can store a plurality of analysis data sets (power spectrum data) for each of the FFTs 451 to 453. The memory 460 is configured always to allow transmission of the latest data upon a data transmission request from the below-described PC 500.

The signal processing controller 470 is connected to the PC 500 by a connection cable 510 for an interface such as USB, RS-232C, or SCSI. In accordance with commands from the PC 500, the signal processing controller 470 controls operations of each portion of the signal processor 400. The signal processor 400 may be configured using software executed on any suitable processor, such as a central processing unit (CPU), or may be configured using a digital signal processor (DSP).

The PC 500 includes an application to evaluate the electronic device 100 with the measurement system 10. The evaluation application is, for example, copied from a CD-ROM or downloaded over a network or the like.

The PC 500 for example displays an application screen based on the evaluation application on a display 520. In accordance with information input via the application screen, the PC 500 transmits a command to the signal processor 400. The PC 500 receives a command acknowledgment and data from the signal processor 400, and in accordance with the received data, executes predetermined processing and displays the measurement results on the application screen. As necessary, the PC 500 outputs the measurement results to the printer 600 to print the measurement results.

In FIG. 4, the sensitivity adjuster 300 and the signal processor 400 are, for example, mounted on the base 30 of the mount 20. The PC 500 and the printer 600 are, for example, disposed separately from the base 30. The signal processor 400 and the PC 500 are, for example, connected by the connection cable 510.

The measurement system 10 evaluates the electronic device 100 by analyzing the frequency component in the combined output of the vibration detection element 56 and the microphone 62 while using a piezoelectric element, for example, to vibrate the panel 102 of the electronic device 100 targeted for measurement. The piezoelectric element that vibrates the panel 102 can have a predetermined measurement frequency range of, for example, 100 Hz to 10 kHz as mentioned above and can be driven with a multi-drive signal wave that combines drive signals at every 100 Hz.

In this embodiment, the microphone 62 measures sound pressure through the ear model unit 50. Accordingly, the power spectrum corresponding to the air-conducted component measured in accordance with output of the microphone 62 is a combination of the sound pressure corresponding to the air-conducted component heard directly through the eardrum by vibration of air due to vibration of the electronic device 100 and sound pressure corresponding to the air-conducted component, heard through the eardrum, of sound produced in the ear itself by the inside of the external ear canal vibrating because of vibration of the electronic device 100. In other words, the power spectrum corresponding to the air-conducted component measured with this embodiment is weighted for the characteristics of sound pressure transmission in a human ear.

The measurement system 10 according to this embodiment uses the phase adjuster 430 to adjust the phases of the output corresponding to the vibration sound from the vibration detection element 56 and the output corresponding to the air-conducted component from the microphone 62, subsequently combines the two outputs using the output combiner 440, and subjects the combined output to frequency analysis using the frequency analyzer 450. The measurement system 10 can thus approximate the human body in measuring the sensory sound pressure that combines the amount of vibration and the sound pressure conducted to the human body by vibration of the electronic device 100 targeted for measurement. Consequently, the measurement system 10 can evaluate the electronic device 100 to a high degree of accuracy and with increased reliability.

In this embodiment, the frequency analyzer 450 independently subjects the output corresponding to the vibration sound from the vibration detection element 56 and the output corresponding to the air-conducted component from the microphone 62 to frequency analysis, thereby allowing the measurement system 10 to evaluate the electronic device 100 in greater detail. The measurement system 10 adjusts the sensitivity of the vibration detection element 56 and of the microphone 62 with the sensitivity adjuster 300, thereby allowing measurement of sensory sound pressure by age or other factors. Hence, the measurement system 10 can evaluate the electronic device 100 in accordance with the function of an individual's ear. Since the measurement system 10 can adjust the frequency characteristics of the output corresponding to the vibration sound from the vibration detection element 56 and of the output corresponding to the air-conducted component from the microphone 62 independently with the frequency characteristic adjuster 420, the electronic device 100 can be evaluated to a higher degree of accuracy in accordance with the function of an individual's ear.

The pressing force, on the ear model unit 50, of the electronic device 100 targeted for measurement is variable, as is the contact position of the electronic device 100, thus allowing the measurement system 10 to evaluate the electronic device 100 in a variety of forms.

Next, correction of the air-conducted sound by the frequency characteristic adjuster (data corrector) 420 is described. This correction is for using the equalizer (EQ) 421 of the frequency characteristic adjuster 420 to reduce the distance between the measured data and an actual ear.

Figures 5, 6:
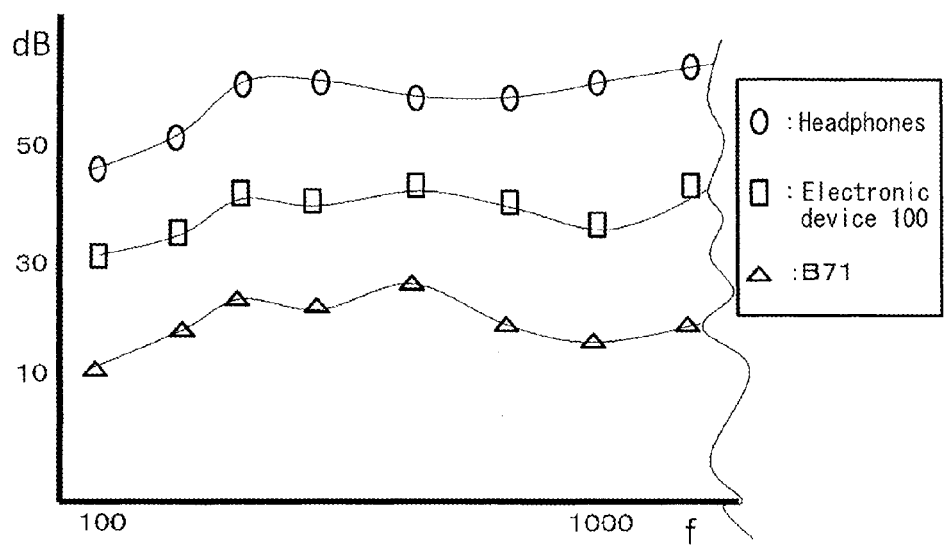
FIG. 5 illustrates measurement results of uncorrected air-conducted sound and vibration sound upon measuring a variety of electronic devices.
FIG. 6 is a partial list of the classification of various electronic devices and the correction values for each of the classified electronic devices.

FIG. 5 is a graph of measurements of air-conducted sound and vibration sound from a B71 Bone Transducer (B71, manufactured by RadioEar), from the electronic device 100, in FIG. 2, that transits vibration through a panel, and from headphones. FIG. 5 plots the numerical result of subtracting the measured vibration sound from the measured air-conducted sound (the difference in dB) for each measurement. As is clear from FIG. 5, the difference increases in the order of B71, electronic device 100, and headphones. In other words, B71 is a type of acoustic apparatus in which vibration contributes greatly to air-conducted sound. The B71 is thus an acoustic apparatus in which the proportion, among the total air-conducted sound measured by the microphone, of air-conducted sound generated by vibration within or at the surface of the ear is greater than in other acoustic apparatuses such as the electronic device 100 or headphones. Conversely, the headphones are a type of acoustic apparatus in which the contribution of vibration is small. The electronic device 100 falls between these two acoustic apparatuses. I discovered that as the proportion of air-conducted sound derived from vibration among the total air-conducted sound is greater, the error of a measurement apparatus in measuring air-conducted sound as compared to an actual ear increases.

As illustrated in FIG. 6, I conceived of changing the correction values to be used in four types of acoustic apparatuses in which the contribution of vibration differs. The four types of acoustic apparatuses in which the contribution of vibration differs are, for example, the B71, one of the electronic devices 100 with a relatively small panel and large vibration, one of the electronic devices 100 with a relatively large panel and small vibration, and headphones. In FIG. 6, four levels of correction values are applied, for example, from the acoustic apparatus with the largest to the smallest difference at 1 kHz.

Instead of the difference at 1 kHz, the average difference from 10 Hz to 1 kHz may be calculated. Depending on the magnitude of the average, five levels of correction values, for example, may be applied. Alternatively, depending on the magnitude of the average from 100 Hz to 2.5 kHz, six levels of correction values, for example, may be applied. The correction value is larger as the difference is smaller for the following reason. The ear model unit 50 (ear model 51 and/or artificial external ear canal 53) according to an example has a greater average hardness than that of the human ear. In greater detail, the ear model unit 50 according to an example has a Shore 00 hardness of approximately 60, which is greater than the hardness of 35 of the ear model stipulated by IEC 60318. The hardness of 60 was adopted to prioritize ease of handling in the manufacturing process. For this reason, as the contribution of vibration is greater in the measured acoustic apparatus, a smaller proportion of the air-conducted sound produced by vibration of the external ear canal is measured. Accordingly, as the contribution of vibration is greater in the acoustic apparatus, the numerical correction value applied to the air-conducted sound is larger.

The correction values may be obtained by comparing the air-conducted sound output of the measurement system with the measurement results from a probe microphone placed inside the ear of approximately 5 to 20 otologically healthy subjects. In other words, the correction values are measured, for example by an adjustment method, on the basis of psychoacoustics using actual ears, and the correction values increase as the contribution of vibration is greater in the acoustic apparatus.

As illustrated in FIG. 7, the user may select which of the correction values are to be applied in the measurement system 10 from among choices displayed on the display 520. While measurement results (i.e. the difference) for three types of acoustic apparatuses were described with reference to FIG. 5, an example of a more detailed classification of the types of correction values is described below. Acoustic apparatuses may, for example, be classified into four types. A greater number of types allows more accurate measurement but requires a greater number of psychoacoustics-based measurement experiments with subjects (actual ears) to obtain the correction values. A measurement system that classifies acoustic apparatuses into two or more types is therefore preferably produced in accordance with the needs of the acoustic apparatus manufacturer.

The user selects the type of correction values to apply by selecting one of the buttons corresponding to types A, B, C, and D. Alternatively, instead of selecting a type, the user can select manual input to allow input of all of the correction values by hand. Upon selecting type A, for example, the type A correction values are automatically input into the correction value table at the top of the screen. Furthermore, plus and minus buttons are displayed to the side of the correction value at each frequency for type A. By operating these buttons, the user can further make minute adjustments to increase or decrease the displayed correction values.

All of the correction values to be applied may instead be applied automatically by measuring the difference between the air-conducted sound and the vibration sound in the acoustic apparatus targeted for measurement and programming which correction values are to be applied.

The calculation steps at this time are as follows. Since the measurement here is for classifying types, the correction values of air-conducted sound may be set to zero for all frequencies. Alternatively, the smallest correction values, i.e. type A for headphones or the like, may be applied to this measurement.

The specific measurement steps in this case are listed below.

Step 1: Measure air-conducted sound and vibration sound without correction (or with the lowest correction values).

Step 2: Calculate the "difference" by subtracting the vibration sound from the air-conducted sound.

Step 3: Automatically (or manually) determine the type in accordance with the difference-based classification table in FIG. 6.

Step 4: Automatically apply the corresponding correction values.

The corrected sound pressure may be obtained by calculation to apply the correction values in step 4 to the data measured in step 1, or measurements may be made again after applying the correction values to the measurement system. The correction values to be applied can thus be selected manually by the user or automatically. The user can also adjust the correction values as desired.

Embodiment 2

Figure 9:
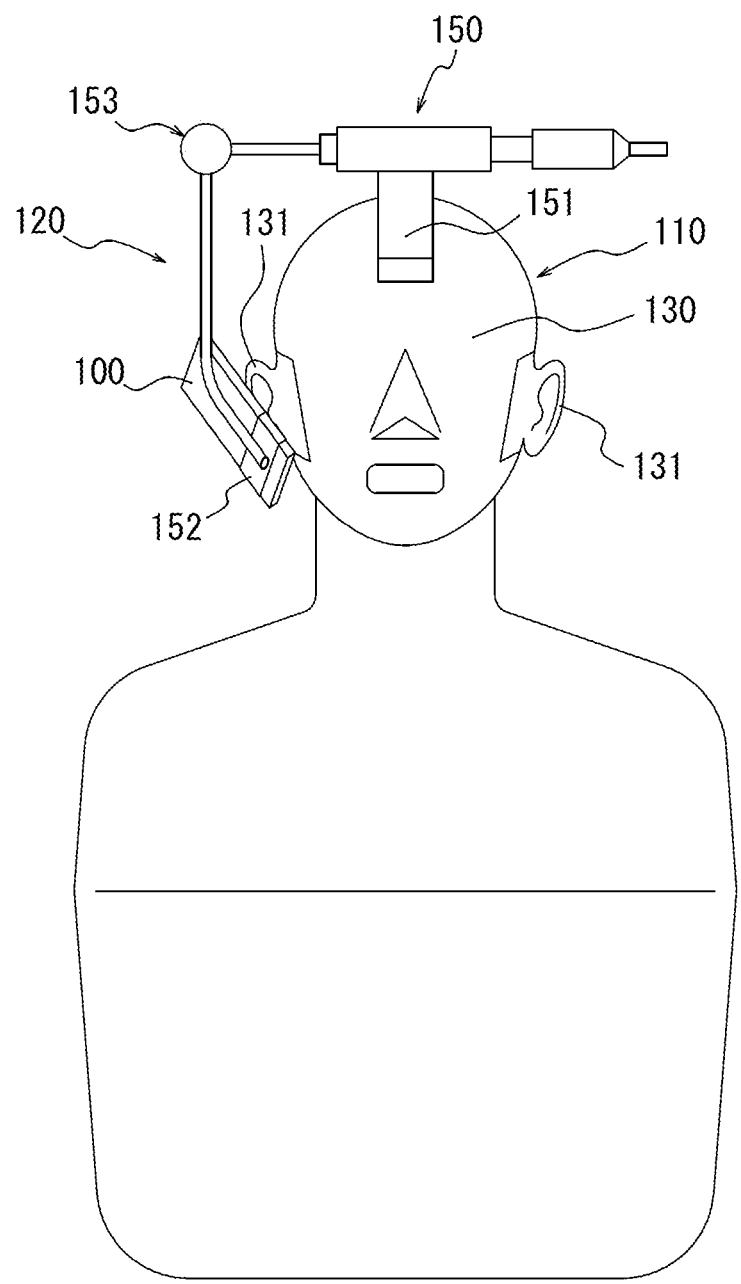
FIG. 9 illustrates the configuration of a measurement system according to Embodiment 2 of this disclosure.

FIG. 9 illustrates the configuration of a measurement system according to Embodiment 2 of this disclosure. In the measurement system 110 of this embodiment, the configuration of a mount 120 differs from that of the mount 20 in Embodiment 1, whereas the remaining configuration is similar to that of Embodiment 1. Accordingly, the measurement unit 200 in Embodiment 1 is omitted from FIG. 9. The mount 120 includes a human head model 130 and a holder 150 that holds the electronic device 100 targeted for measurement. The head model 130 is, for example, HATS, KEMAR, or the like. Artificial ears 131 of the head model 130 are detachable from the head model 130.

Figure 10A:
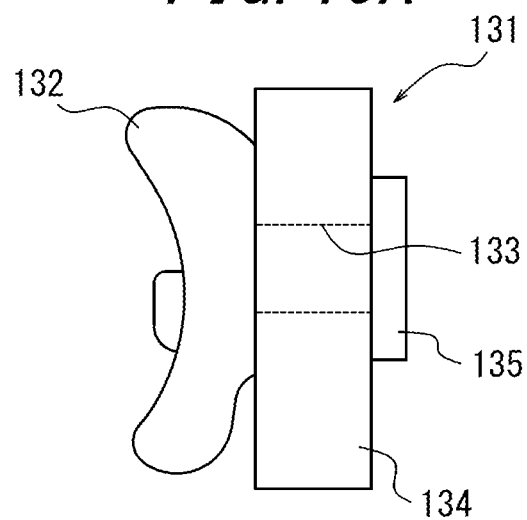
FIGS. 10A and 10B are partial detailed views of the measurement system according to Embodiment 2 of this disclosure.
Figure 10B:
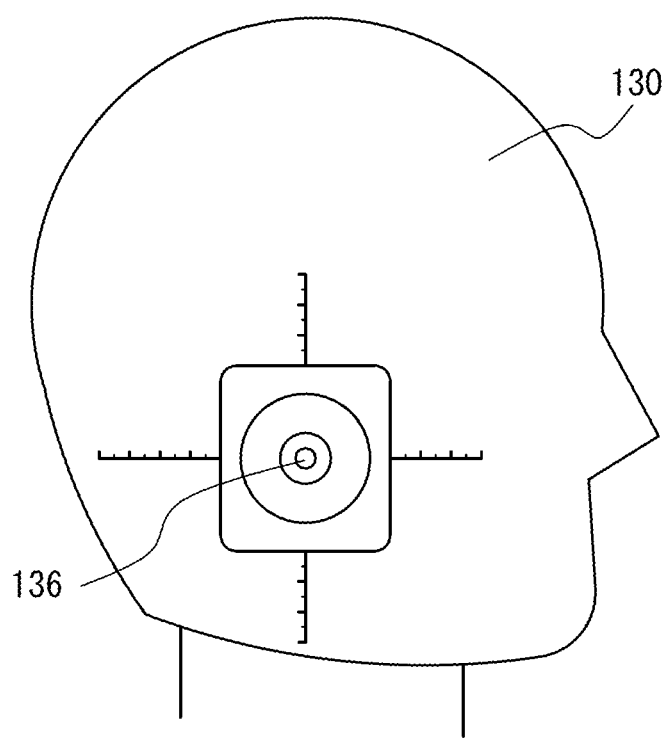

The artificial ears 131 constitute ear model units. Each artificial ear 131 includes, like the ear model unit 50 in Embodiment 1, an ear model 132 and an artificial external ear canal unit 134, joined to the ear model 132, in which an artificial external ear canal 133 is formed, as illustrated by the side view in FIG. 10A of the artificial ear 131 removed from the head model 130. Like the ear model unit 50 in Embodiment 1, a vibration detector 135 provided with a vibration detection element is disposed at the periphery of the opening in the artificial external ear canal 133 in the artificial external ear canal unit 134. As illustrated by the side view in FIG. 10B with the artificial ear 131 removed, a sound pressure gauge 136 provided with a microphone is disposed in the central region on the mount for the artificial ear 131 in the head model 130. The sound pressure gauge 136 is disposed so as to measure sound pressure of sound propagating through the artificial external ear canal 133 of the artificial ear 131 once the artificial ear 131 is mounted on the head model 130. Like the ear model unit 50 in Embodiment 1, the sound pressure gauge 136 may be disposed on the artificial ear 131 side. The vibration detection element constituting the vibration detector 135 and the microphone constituting the sound pressure gauge 136 are connected to the measurement unit in a similar way as in Embodiment 1.

A holder 150 is attached to the head model 130 detachably and includes a head fixing portion 151 for fixing to the head model 130, a support 152 that supports the electronic device 100 targeted for measurement, and an articulated arm 153 connecting the head fixing portion 151 and the support 152. The holder 150 is configured like the holder 70 in Embodiment 1 to allow adjustment, via the articulated arm 153, of the pressing force and contact position of the electronic device 100, which is supported by the support 152, on the artificial ear 131.

The measurement system 110 of this embodiment achieves effects similar to those of the measurement system 10 of Embodiment 1. Among other effects, the measurement system 110 of this embodiment evaluates the electronic device 100 by detachably mounting the artificial ear 131 for vibration detection on the human head model 130. Evaluation can thereby conform more closely to the actual form of use by taking into consideration the effect of the head.

The techniques described in Embodiment 1 related to correction with the correction values may of course be similarly applied.

At this time, the approaches to correction values and types of classification in Embodiment 1 may be applied, or the air-conducted sound and vibration sound may be measured for each embodiment of the measurement system, with correction values being similarly determined by correspondence with actual ears.

This disclosure is not limited to the above embodiments, and a variety of modifications and changes are possible. For example, in the above embodiment, the electronic device 100 targeted for measurement is envisioned as the following: a mobile phone, such as a smartphone, that vibrates with the panel 102 as the vibrating body; the B71; and headphones. However, this measurement system may also similarly evaluate an acoustic apparatus for which a bone-conduction earphone and a piezoelectric element wrapped with rubber are placed in contact with the tragus.

REFERENCE SIGNS LIST

10 Measurement system
20 Mount
30 Base
50 Ear model unit
51 Ear model
52 Artificial external ear canal unit
53 Artificial external ear canal
54 Support member
55 Vibration detector
56 Vibration detection element
60 Sound pressure gauge
61 Tube member
62 Microphone
70 Holder
71 Support
72 Arm
73 Movement adjuster
100 Electronic device
101 Housing
102 Panel (vibrating body)
110 Measurement system
120 Mount
130 Head model
131 Artificial ear
132 Ear model
133 Artificial external ear canal
134 Artificial external ear canal unit
135 Vibration detector
136 Sound pressure gauge
150 Holder
151 Head fixing portion
152 Support
153 Articulated arm
200 Measurement unit
300 Sensitivity adjuster
400 Signal processor
410 A/D converter
420 Frequency characteristic adjuster (data corrector)
430 Phase adjuster
440 Output combiner
450 Frequency analyzer
460 Memory
470 Signal processing controller
500 PC
520 Display
600 Printer

The invention claimed is:

1. A measurement system for evaluating an electronic device that transmits air-conducted sound, generated by vibration of a vibrating body, to a user by the vibrating body being placed in contact with a human ear, the measurement system comprising:
   an ear model unit contacted by the vibrating body;
   a sound pressure gauge configured to measure air-conducted sound generated by the electronic device and air-conducted sound generated in the ear model unit; and
   a signal processor configured to correct a sound pressure measured by the sound pressure gauge, wherein
   the signal processor corrects the sound pressure using a correction value selected from among a plurality of correction values.

2. The measurement system of claim 1, wherein the user selects the correction value from among the plurality of correction values.

3. The measurement system of claim 1, further comprising a vibration detector configured to measure vibration transmitted to the model ear unit.

4. The measurement system of claim 3, wherein the measurement system selects the correction value from among the plurality of correction values using a value detected by the vibration detector and one of a sound pressure of air-conducted sound before correction and a sound pressure of air-conducted sound when temporarily selecting a temporary correction value.

5. The measurement system of claim 4, wherein
a first correction value is selected when measuring a first electronic device for which a difference yielded by subtracting the value detected by the vibration detector from the sound pressure of air-conducted sound is equal to or greater than 40 dB,
a second correction value is selected when measuring a second electronic device for which the difference is less than 40 dB, and
the first correction value is equal to or less than the second correction value.

6. The measurement system of claim 1, wherein the signal processor operates as a portion of a frequency characteristic adjuster capable of adjusting a frequency characteristic of the sound pressure measured by the sound pressure gauge.

7. The measurement system of claim 3, further comprising a frequency characteristic adjuster capable of adjusting a frequency characteristic of a value detected by the vibration detector.

8. The measurement system of claim 1, further comprising a human head model, wherein the ear model unit is an artificial ear forming part of the head model and is detachable from the head model.

9. The measurement system of claim 1, wherein
the ear model unit comprises an ear model and an artificial external ear canal unit joined to the ear model, and
an artificial external ear canal is formed in the artificial external ear canal unit.

10. The measurement system of claim 1, further comprising a holder configured to hold the electronic device.

11. The measurement system of claim 10, wherein the holder comprises a support supporting the electronic device at least at two locations as when a person presses the electronic device against an ear.

12. The measurement system of claim 10, wherein the holder is capable of adjusting the electronic device by moving the electronic device vertically relative to the ear model unit to change a contact position of the electronic device on the ear model unit.

* * * * *